United States Patent
Mizoguchi (10) Patent No.: US 11,360,158 B2
(45) Date of Patent: Jun. 14, 2022

(54) INSULATION RESISTANCE MEASURING APPARATUS

(71) Applicant: DENSO CORPORATION, Kariya (JP)

(72) Inventor: Tomomichi Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 65 days.

(21) Appl. No.: 16/923,268

(22) Filed: Jul. 8, 2020

(65) Prior Publication Data

US 2021/0011092 A1   Jan. 14, 2021

(30) Foreign Application Priority Data

Jul. 8, 2019   (JP) .............................. JP2019-127173

(51) Int. Cl.
   *G01R 31/00*   (2006.01)
   *G01R 31/52*   (2020.01)
   *B60L 3/00*    (2019.01)
   *G01R 27/16*   (2006.01)

(52) U.S. Cl.
   CPC ............ *G01R 31/52* (2020.01); *B60L 3/0069* (2013.01); *G01R 27/16* (2013.01)

(58) Field of Classification Search
   USPC ................. 324/509, 541, 551, 557
   See application file for complete search history.

(56) References Cited

U.S. PATENT DOCUMENTS

| 2006/0102476 A1* | 5/2006 | Niwa ................. G01N 27/4067 204/421 |
| 2008/0084219 A1* | 4/2008 | Belkhayat .............. G01R 27/16 324/649 |
| 2012/0280697 A1* | 11/2012 | Morimoto .............. G01R 27/18 324/606 |
| 2016/0202301 A1 | 7/2016 | Mizoguchi et al. |

FOREIGN PATENT DOCUMENTS

| JP | H11-218554 A | 8/1999 |
| JP | 2006-078449 A | 3/2006 |
| JP | 2012-037278 A | 2/2012 |

* cited by examiner

*Primary Examiner* — Vincent Q Nguyen
(74) *Attorney, Agent, or Firm* — Oliff PLC (57) ABSTRACT

An insulation resistance measuring apparatus designed to calculate a complex impedance of an ac circuit including a measuring resistor, a coupling capacitor, an insulation resistor installed in a vehicle, and a ground capacitance. The insulation resistance measuring apparatus includes a sine wave current applying device which applies an ac signal to the measuring resistor and measures a voltage change appearing at a junction of the sine wave current applying device and the measuring resistor. The ac signal and the voltage change are used to determine the complex impedance. A resistance value of the insulation resistor is calculated as a function of the complex impedance. This structure enables the circuit to be reduced in size.

5 Claims, 7 Drawing Sheets

INSULATION RESISTANCE MEASURING APPARATUS

CROSS REFERENCE TO RELATED DOCUMENT

The present application claims the benefit of priority of Japanese Patent Application No. 2019-127173 filed on Jul. 8, 2019, the disclosure of which is incorporated herein by reference.

BACKGROUND

1 Technical Field

This disclosure relates generally to an insulation resistance measuring apparatus.

2 Background Art

Japanese Patent First Publication No. 2016-128753 discloses a ground fault detecting device (i.e., an insulation resistance measuring device) which is used in an in-vehicle power supply system equipped with a power circuit which includes a battery and electrical devices and is electrically insulated from a vehicle body serving as the ground. The electrical devices include a DC-DC converter connected to the battery through a first relay, an inverter, a rotating electrical machine, a battery charger connected to the battery through a second relay.

The insulation resistance measuring device is designed to apply an ac voltage to the power circuit through a measuring resistor and a coupling capacitor and measure a wave height of an ac signal derived by dividing the ac voltage by the measuring resistor and an insulation resistance between the power circuit and the vehicle body. The insulation resistance measuring device then compares the wave height with a threshold value to diagnose occurrence of an electrical leakage or short between the power circuit and the vehicle body.

A junction of the measuring resistor which leads to the battery has a risk that a high voltage may be temporarily applied thereto through the coupling capacitor due to a change in common capacitance of the vehicle. A signal input connected to the junction of the measuring resistor leading to the battery is, therefore, required to have a high voltage resistance, thus resulting in an increased size of a circuit including the signal input. This may lead to an increase in production cost of the circuit.

SUMMARY

It is, thus, an object of this disclosure to provide an insulation resistance measuring apparatus which enables to reduce the size of a circuit thereof.

According to one aspect of this disclosure, there is provided an insulation resistance measuring apparatus which comprises: (a) a coupling capacitor which is connected at a first end thereof to a power supply path leading to a dc power supply; (b) a measuring resistor which is connected to a second end of the coupling capacitor; (c) a current applying device which is connected to the measuring resistor and applies an ac current to the measuring resistor; (d) a detector which detects a voltage change at a junction of the current applying device and the measuring resistor when the ac current is applied to the measuring resistor; and (e) a calculator which calculates a complex impedance in an ac circuit using the ac current and the voltage change derived by the detector. The ac circuit includes the measuring resistor, the coupling capacitor, an insulation resistor, and a grounding capacitance. The insulation resistor is disposed between the power supply path and ground. The calculator determines a resistance value of the insulation resistor using the complex impedance.

The insulation resistance measuring apparatus is designed to measure the voltage change appearing at the junction between the current applying device and the measuring resistor, not between the coupling capacitor and the measuring resistor, thereby resulting in a decrease in required voltage resistance of the detector by use of the measuring resistor. This enables the ac circuit to be reduced in size.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

The first embodiment in which an insulation resistance measuring apparatus is used in a vehicle, such as a hybrid vehicle or an electrical vehicle equipped with a rotating electrical machine will be described below with reference to the drawings.

Figure 1:
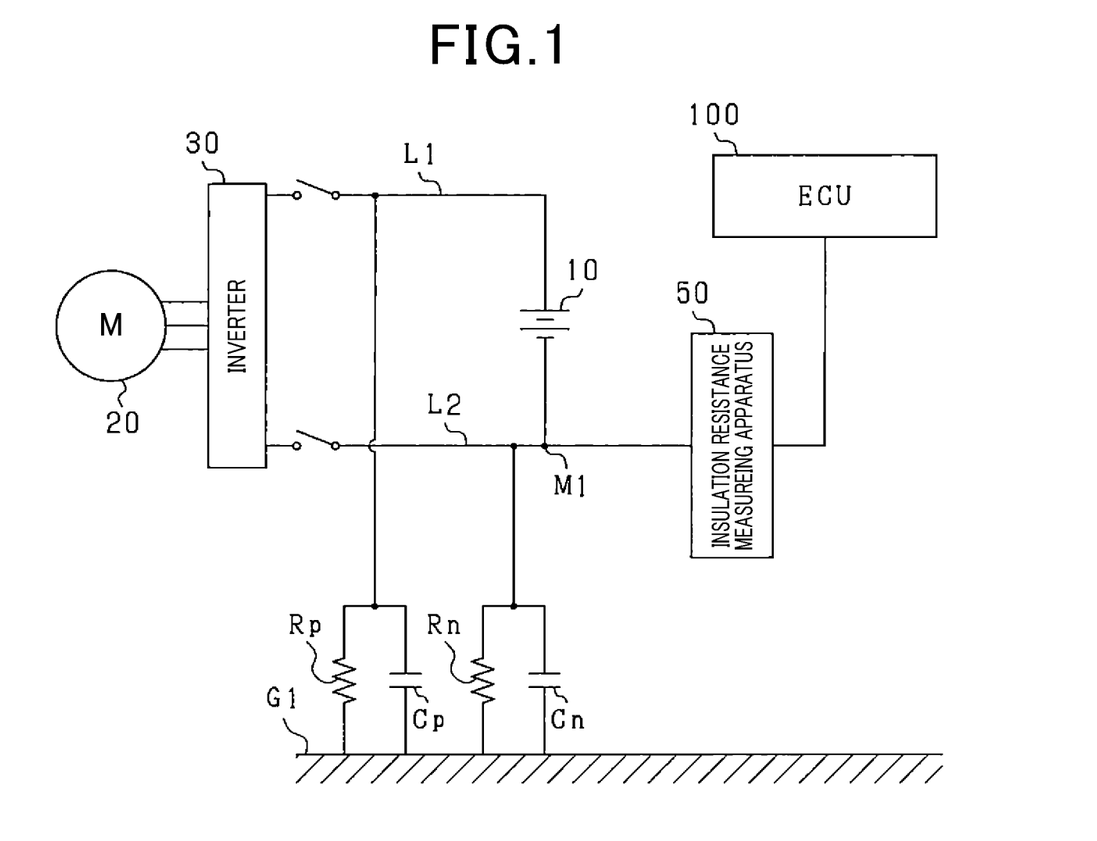
FIG. 1 is an electrical circuit diagram which illustrates an in-vehicle motor control system.

An in-vehicle motor control system, as illustrated in FIG. 1, includes the battery unit 10, the electrical motor 20, the inverter 30, and the insulation resistance measuring apparatus 50.

The battery unit 10 is electrically connected to the electrical motor 20 through the inverter 30. The battery unit 10 is implemented by a storage battery whose terminal-to-terminal voltage is, for example, 100V or more. The battery unit 10 is made of a plurality of battery modules connected in series with each other. Each of the battery modules includes a plurality of electrochemical cells, such as lithium-ion cells or nickel-hydride cells, connected in series with each other. The battery unit 10 works as a dc power supply.

The electrical motor 20 is used as a main power source installed in the vehicle to transmit power to driven wheels, not shown, of the vehicle. The electrical motor 20 is implemented by a three-phase permanent magnet synchronous motor in this embodiment.

The inverter 30 is made of a full-bridge circuit equipped with as many sets of upper and lower arms as the number of phases of a winding of the electrical motor 20. The arms have mounted thereon switches, such as semiconductor switches, which are turned on or off to control an electrical current supplied to each phase winding of the electrical motor 20.

The inverter 30 has installed therein an inverter controller, not shown, which analyzes a variety of parameters associated with the electrical motor 20 to control on-off operations of switches mounted in the inverter 30 to drive the electrical motor 20 in response to a motor mode request or an electrical generator mode request. Specifically, when receiving the motor mode request, the inverter controller works to supply electrical power from the battery unit 10 to the electrical motor 20 through the inverter 30 to drive the electrical motor 20 in the motor mode. Alternatively, when receiving the electrical generator mode request, the inverter controller works to operate the electrical motor 20 in the generator mode using power produced by the driven wheels of the vehicle and convert or deliver electrical power generated by the electrical motor 20 to the battery unit 10 through the inverter 30, thereby charging the battery unit 10.

The battery unit 10 is electrically connected at a positive terminal thereof to the positive-side power supply path L1. The positive-side power supply path L1 is electrically connected to a positive terminal of an electrical load, such as the inverter 30. The positive-side power supply path L1 is electrically insulated from the ground G1, such as a vehicle body. A state of electrical insulation between the positive-side power supply path L1 and the ground G1 may be expressed by an insulation resistance Rp (also referred to as an insulation-to-ground resistance). A ground capacitance (i.e., a common capacitance), such as a denoising capacitor or a floating capacitance, usually exists between the positive-side power supply path L1 and the ground G1. Such a capacitance will be referred to below as a ground capacitance Cp.

Similarly, the battery unit 10 is electrically connected at a negative terminal thereof to the negative-side power supply path L2. The negative-side power supply path L2 is also electrically connected to a negative terminal of the inverter 30. The negative-side power supply path L2 is electrically insulated from the ground G1. A state of electrical insulation between the negative-side power supply path L2 and the ground G1 may be expressed by an insulation resistance Rn (also referred to as an insulation-to-ground resistance). A ground capacitance (i.e., a common capacitance), such as a denoising capacitor or a floating capacitance, usually exists between the negative-side power supply path L2 and the ground G1. Such a capacitance will be referred to below as a ground capacitance Cn.

In the following discussion, a combination of the insulation resistors Rp and Rn will also be referred to as an insulation resistor Rg. A combination of the ground capacitances Cp and Cn will also be referred to as a grounding capacitance Cg.

The insulation resistance measuring apparatus 50 is connected to one of the positive-side power supply path L1 and the negative-side power supply path L2 and measures a resistance value of the insulation resistor Rg to determine whether the positive-side power supply path L1 and the negative-side power supply path L2 are properly insulated from the ground G1, that is, whether a current leakage is occurring or not. The insulation resistance measuring apparatus 50 will be described below in detail.

Figure 2:
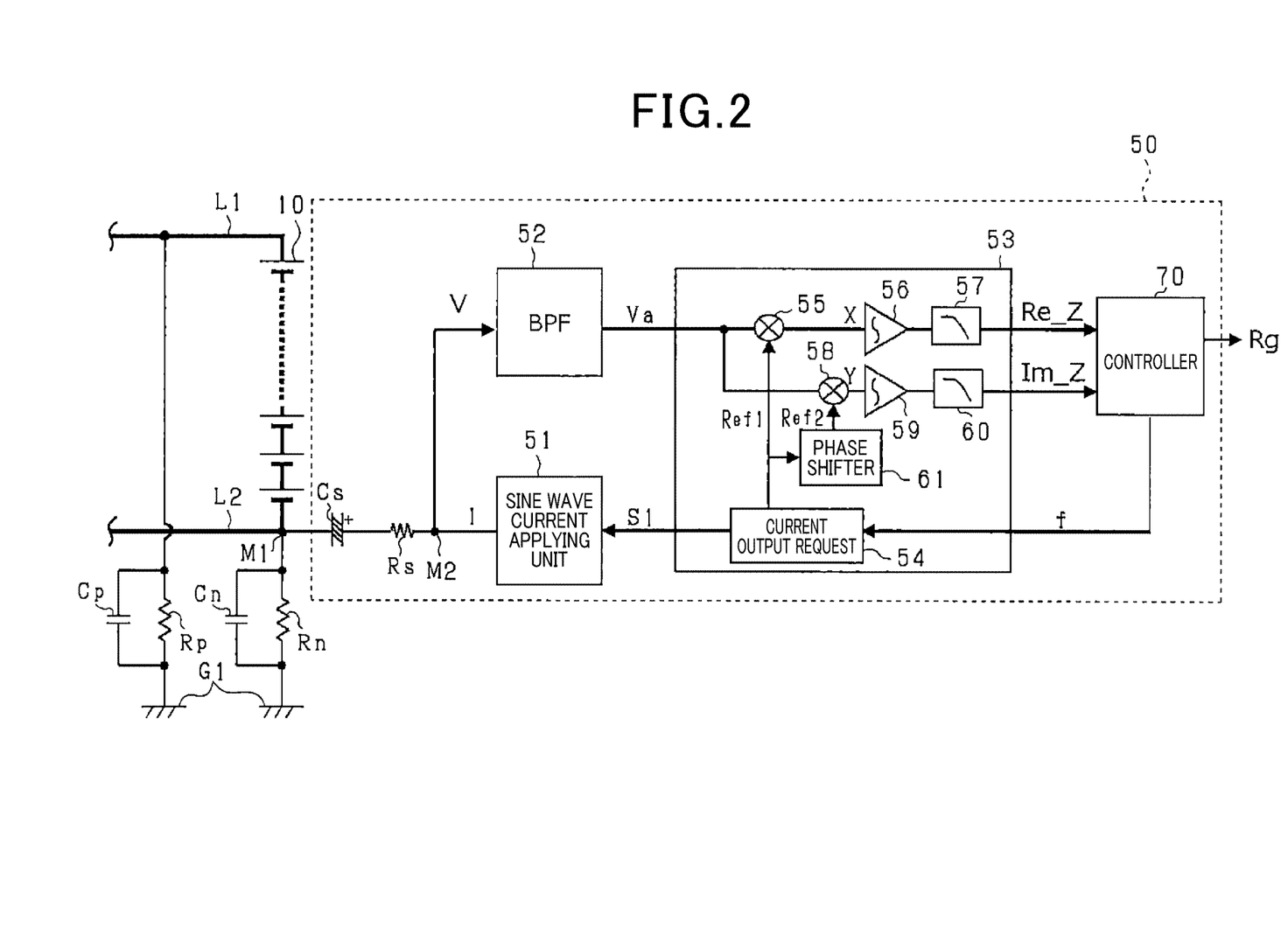
FIG. 2 is an electrical circuit diagram which illustrates an insulation resistance measuring apparatus according to the first embodiment.

The principle of how to measure a resistance value of the insulation resistor Rg will be discussed below. The insulation resistance measuring apparatus 50, as illustrated in FIG. 2, includes the coupling capacitor Cs connected at an end thereof to the power supply paths L1 and L2, the measuring resistor Rs connected to the other end of the coupling capacitor Cs, and the sine wave current applying device 51 (i.e., an ac power supply) working to output an ac signal I in the form of a sine wave current (i.e., an alternating current). The sine wave current applying device 51 delivers the sine wave current to the ground capacitance Cg and the insulation resistor Rg through the measuring resistor Rs, the coupling capacitor Cs, and the battery unit 10. In the in-vehicle motor control system, the sine wave current applying device 51, the coupling capacitor Cs, the measuring resistor Rs, the ground capacitance Cg, and the insulation resistor Rg are represented by an equivalent circuit demonstrated in FIG. 3. The battery unit 10 serves as a dc (direct current) power supply and has an electrical capacitance much larger than the ground capacitance Cg and is thus omitted from the equivalent circuit.

Figure 3:
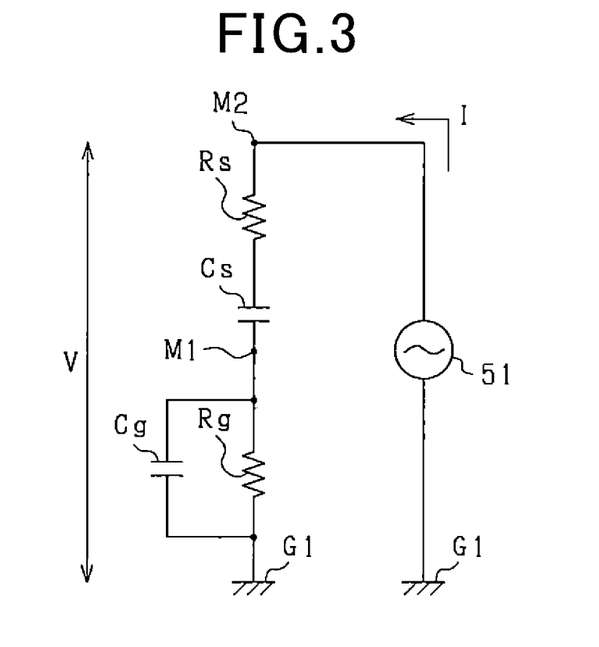
FIG. 3 is a circuit diagram which demonstrates an equivalent circuit of an ac circuit including the insulation resistance measuring apparatus in FIG. 2.

Next, a change in measured voltage V when the ac signal I is outputted in the form of a sine wave current from the sine wave current applying device 51 in the equivalent circuit in FIG. 3 will be described below. When the ac signal I flows in the equivalent circuit, it will cause the measured voltage V appearing between the junction M2 and the ground G1 to undergo a change that is a function of or depends on a complex impedance in an ac circuit (i.e., the equivalent circuit). Therefore, by extracting a component representing a change in voltage arising from the frequency f of the applied ac signa I from a change in voltage developed at the junction M2, the complex impedance in the ac circuit may be determined based on the change in voltage arising from the frequency f. The frequency f will also be referred to below as a measurement frequency.

Figure 4:
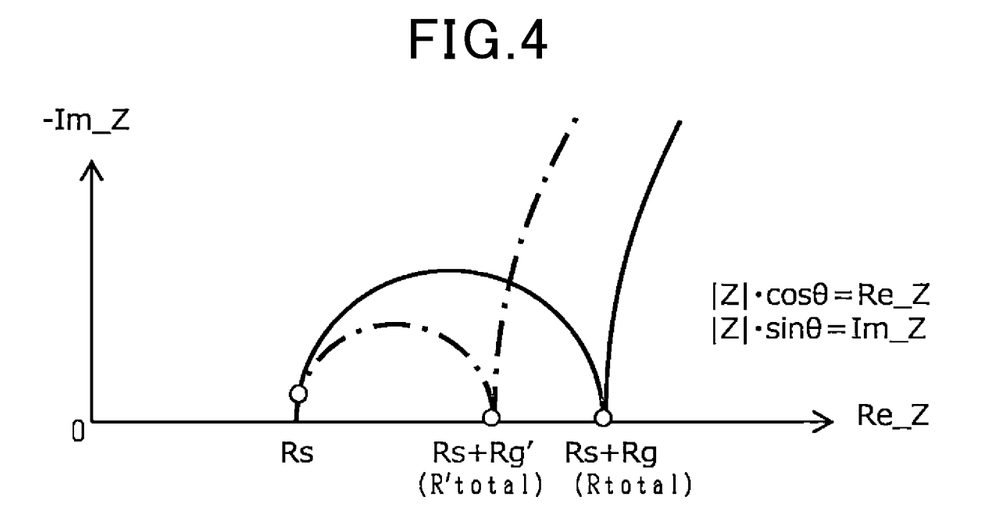
FIG. 4 is a view which represents complex impedance characteristics.

The above ac circuit has complex impedance characteristics illustrated in FIG. 4. FIG. 4 shows that when the phase θ of the complex impedance is zero, in other words, the imaginary part Im_Z of the complex impedance is zero, the real part Re_Z (or an absolute value |Z|) of the complex impedance will be identical with a value of the measuring resistor Rs or a total value Rtotal of values of the insulation resistor Rg and the measuring resistor Rs. A value of the insulation resistor Rg is, therefore, derived by changing the frequency f of the sine wave current within a given frequency range.

Based on the above principle, the insulation resistance measuring apparatus 50 is designed to derive the complex impedance characteristics and determine the value of the insulation resistor Rg as a function of the complex impedance. The structure and measuring operation of the insulation resistance measuring apparatus 50 will also be described below in detail.

The insulation resistance measuring apparatus 50 is, as can be seen in FIG. 2, equipped with the coupling capacitor Cs connecting with the negative-side power supply path L2, the measuring resistor Rs connecting with the coupling capacitor Cs, and the sine wave current applying device 51 which connects with the measuring resistor Rs and works as a current applying circuit to output the ac signal I.

The sine wave current applying device 51, the measuring resistor Rs, and the coupling capacitor Cs are connected in series with each other. The sine wave current applying device 51 is connected to the coupling capacitor Cs through the measuring resistor Rs. The coupling capacitor Cs connects with the junction M1 in the negative-side power supply path L2. The coupling capacitor Cs works to block a dc component of an input, but permits passage of an ac component of the input between the insulation resistance measuring apparatus 50 (i.e., a low voltage circuit) and the battery unit 10, the inverter 30, or the electrical motor 20 (i.e., a high voltage circuit).

The insulation resistance measuring apparatus 50 is also equipped with the bandpass filter 52 which is connected to the junction M2 of the measuring resistor Rs and the sine wave current applying device 51 and works to measure the voltage appearing at the junction M2. The bandpass filter 52 is connected to the lock-in amplifier 53. The bandpass filter 52 extracts only a component of a signal (i.e., a voltage signal), as inputted thereinto through the junction M2, which lies in a given frequency band and outputs it to the lock-in amplifier 53.

The insulation resistance measuring apparatus 50 is also equipped with the lock-in amplifier 53 working as a detector. The lock-in amplifier 53 is connected to the sine wave current applying device 51 and equipped with the current output request unit 54 which outputs a request for the sine wave current applying device 51 to output the ac signal I. Specifically, the current output request unit 54 is connected to the controller 70 which will be described later in detail and transmits a request signal S1 to the sine wave current applying device 51 to output the ac signal I of the frequency f, as specified by the controller 70, in the form of a sine wave current.

The current output request unit 54 is engineered to output the first reference signal Ref1 to the multiplier 55. The first reference signal Ref1 is in the form of a sine wave current of the frequency f and outputted synchronously with the ac signal I from the sine wave current applying device 51. The ac signal I and the first reference signal Ref1 are, therefore, identical in phase with each other.

The current output request unit 54 is designed to output the second reference signal Ref2. The second reference signal Ref2 is in the form of a sine wave current which is 90° out of phase with the first reference signal Ref1 (i.e., the ac signal I). In other words, the first reference signal Ref1 is selected to have a phase difference of 90° between itself and the second reference signal Ref2. Specifically, the current output request unit 54 outputs the first reference signal Ref1 through the phase shift circuit 61 installed in the lock-in amplifier 53 to produce the second reference signal Ref2 which is, in turn, outputted to the multiplier 58.

The lock-in amplifier 53 is equipped with the multipliers 55 and 58, the integrators 56 and 59, and the filters 57 and 60. The multiplier 55 calculates a produce X of a response signal Va and the first reference signal Ref1. The response signal Va is in the form of a voltage signal (i.e., a voltage change) inputted to the multiplier 55 from the bandpass filter 52. The multiplier 55 outputs the product X to the integrator 56. The integrator 56 averages the product X and outputs it to the controller 70 through the filter 57. The filter 57 is made of a low-pass filter and thus outputs a value proportional to the real part Re_Z of the complex impedance in the ac circuit illustrated in FIG. 3 to the controller 70.

The multiplier 58 calculates a produce Y of the response signal Va and the second reference signal Ref2. The response signal Va is in the form of a voltage signal (i.e., a voltage change) inputted to the multiplier 58 from the bandpass filter 52. The multiplier 58 outputs the product Y to the integrator 59. The integrator 59 averages the product Y and outputs it to the controller 70 through the filter 60. The filter 60 is made of a low-pass filter and thus outputs a value proportional to the imaginary part Im_Z of the complex impedance in the ac circuit illustrated in FIG. 3 to the controller 70.

The insulation resistance measuring apparatus 50 is, as described above, equipped with the controller 70 serving as an arithmetic circuit or calculator. The controller 70 is implemented by an electronic control unit which is equipped with a known microcomputer made up of a CPU, a ROM, a RAM, and a flash memory and perform a variety of arithmetic operations to execute given control tasks. For instance, the controller 70 determines the frequency f of the ac signal I and instructs the sine wave current applying device 51 to output the ac signal I. After outputting the ac signal I, the controller 70 receives results through the lock-in amplifier 53 as being proportional to the real part Re_Z and the imaginary part Im_Z of the complex impedance. The controller 70 then analyzes a value proportional to the real part Re_Z of the complex impedance, a value proportional to the imaginary part Im_Z of the complex impedance, as inputted from the lock-in amplifier 53, and the ac signal I to calculate the phase θ and an absolute value |Z| of the complex impedance. The controller 70 also cyclically alters the frequency f of the ac signal I and derives values of the complex impedance at the respective frequencies f.

The sequential altering of the frequency f of the ac signal I enables the complex impedance characteristics to be represented, as illustrated in FIG. 4, on a complex plane. A chain line in FIG. 4 indicates the complex impedance characteristic when a resistance value of the insulation resistor Rg is decreased.

Figure 5A:
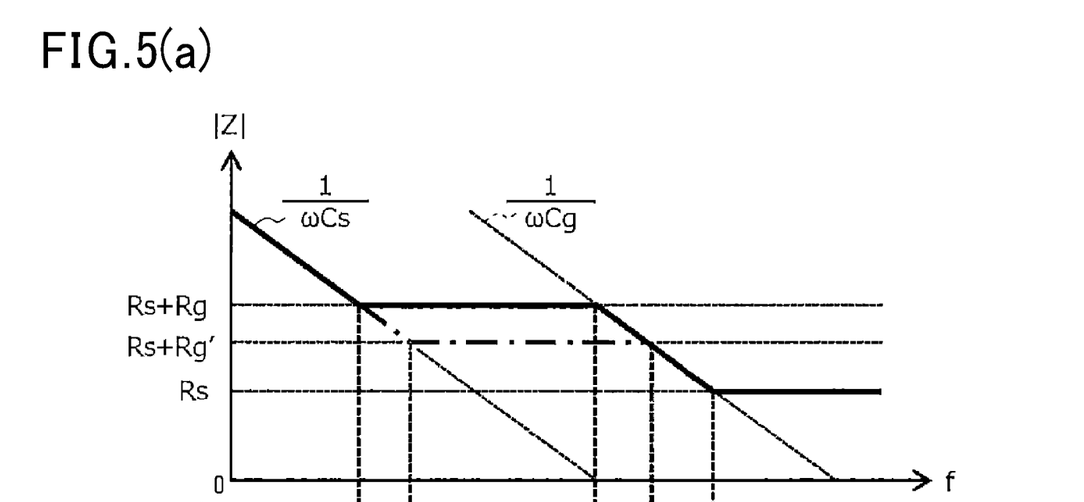
FIG. 5(a) is a view which represents a relation between a measurement frequency and an absolute value of a complex impedance.
Figure 5B:
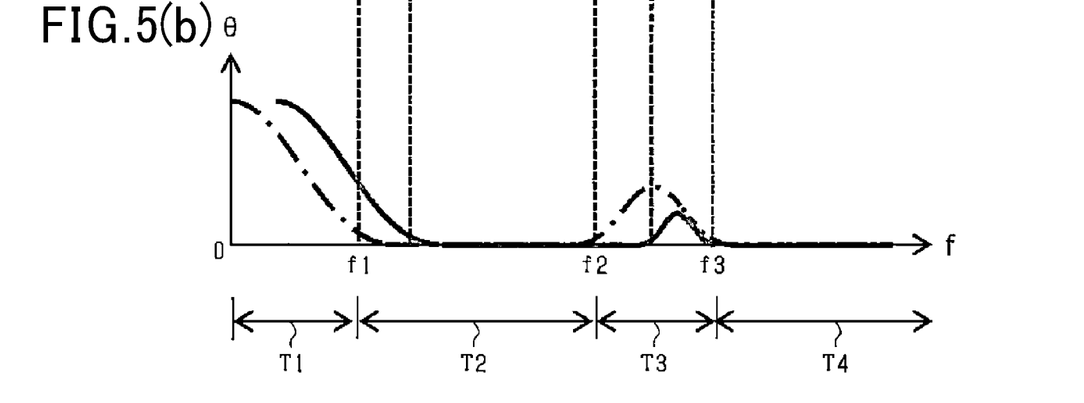
FIG. 5(b) is a view which represents a relation between a measurement frequency and a phase of a complex impedance.

FIG. 5(a) represents a relation between the absolute value |Z| of the complex impedance and the frequency f. FIG. 5(b) represents a relation between the phase θ of the complex impedance and the frequency f. A chain line in FIGS. 5(a) and 5(b) indicates the relations when a resistance value of the insulation resistor Rg is decreased.

When the frequency f is changed in the way illustrated in FIGS. 5(a) and 5(b), two frequency bands: the second range T2 and the fourth range T4 will appear within which the phase θ of the complex impedance becomes zero, and the absolute value |Z| is kept constant. More specifically, in a range from when the frequency f is zero until the first frequency f1 is reached, the absolute value |Z| of the complex impedance decreases in reverse proportion to an increase in frequency f. In the following discussion, the range from when the frequency f is zero until the first frequency f1 is reached will be referred to below as the first range T1. In a range from when the frequency f is the first frequency f1 until the second frequency f2 is reached, the absolute value |Z| of the complex impedance is kept constant regardless of an increase in frequency f. Such a range will also be referred to below as the second range T2.

In a range when the frequency f is the second frequency f2 until the third frequency f3 is reached, the absolute value |Z| of the complex impedance is decreased in reverse proportion to an increase in frequency f. Such a range will also be referred to as the third range T3. When the frequency f is higher than the third frequency f3, the absolute value |Z| of the complex impedance is kept constant regardless of an increase in frequency f. Such a range will also be referred to as the fourth range T4.

In each of the second range T2 and the fourth range T4, the phase θ of the complex impedance is, as clearly demonstrated in FIG. 5(b), zero. In other words, when the frequency f is being changed, but the absolute value |Z| is kept constant, the phase θ of the complex impedance may be determined to be zero. When a resistance value of the insulation resistor Rg is decreased, and the first frequency f1 and the second frequency f2 are increased, the second range T2 will appear unless the resistance value of the insulation resistor Rg becomes zero.

The absolute value |Z| when the phase θ of the complex impedance is zero will be, as illustrated in FIG. 4, either the resistance value of the measuring resistor Rs or the total Rtotal of the resistance values of the measuring resistor Rs and the insulation resistor Rg.

The insulation resistance measuring apparatus 50 is, therefore, designed to use the above facts to determine the resistance value of the insulation resistor Rg. Specifically, the controller 70 changes the frequency f of the ac signal I and then calculates values of the complex impedance at respective values of the frequency f. The controller 70 then specifies the second range T2 and the fourth range T4 in which the absolute value |Z| is kept constant regardless of a change in frequency f. Subsequently, the controller 70 compares the absolute value |Z| with the measuring resistor Rs in the second range T2 and the fourth range T4 to determine whether the absolute value |Z| is the measuring resistor Rs or the total Rtotal. When determining the absolute value |Z| as being the total Rtotal, the controller 70 subtracts the resistance value of the measuring resistor Rs from the total Rtotal to derive the resistance value of the insulation resistor Rg. Subsequently, the controller 70 compares the resistance value of the insulation resistor Rg with an electrical leakage threshold value to determine whether a current leakage is occurring or not. The controller 70 outputs the determined value of the insulation resistor Rg and the result of determination of the current leakage to the ECU 100 connected to the insulation resistance measuring apparatus 50.

The third range T3 depends upon the angular velocity ω and the ground capacitance Cg (i.e., 1/ωCg). For example, the third range T3 is shifted to a low frequency side with an increase in the ground capacitance Cg. Alternatively, the third range T3 is shifted to a high frequency side with a decrease in the ground capacitance Cg. The ground capacitance Cg produced between the power supply circuit and the vehicle body is changed as a function of the number of electrical devices electrically connecting with the battery. The shifting of the third range T3 will cause the second range T2 and the fourth range T4 to be shifted.

The second range T2 and the fourth range T4 in which the absolute value |Z| is kept constant may, however, be detected by ensuring a required range of measurement of the frequency f even though the second range T2 to the fourth range T4 are changed with a change in ground capacitance Cg. The absolute value |Z| in the second range T2 or the fourth range T4 will not be changed with a change or shift in the second range T2 or the fourth range T4. The way to calculate the absolute value |Z| in this embodiment, therefore, ensures required accuracy in calculating the resistance value of the insulation resistor Rg even though the ground capacitance Cg is changed.

Figure 6:
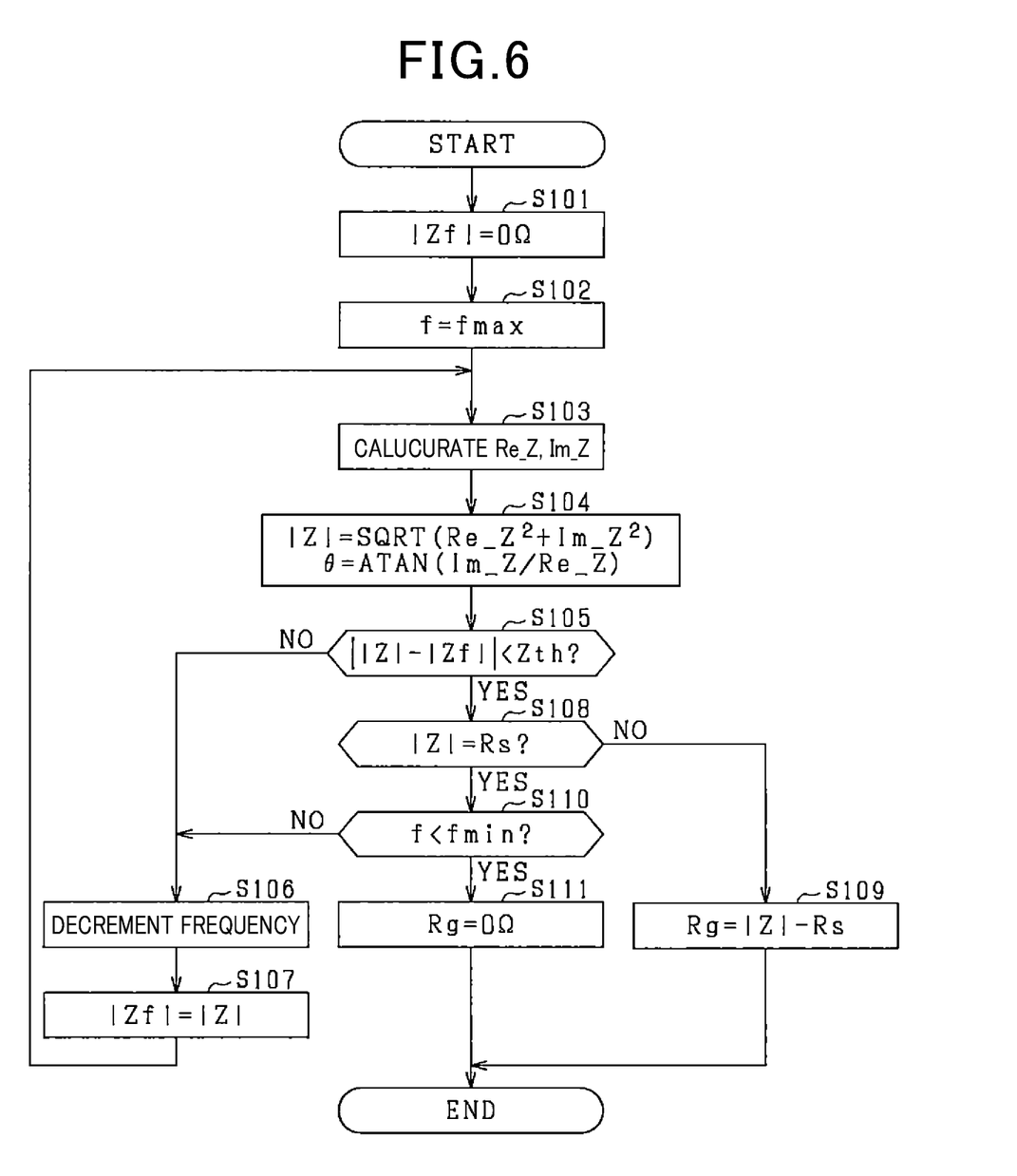
FIG. 6 is a flowchart of an insulation resistance measuring program executed by the insulation resistance measuring apparatus in FIG. 1.

A measuring operation of the insulation resistance measuring apparatus 50 will be described with reference to FIG. 6. The measuring operation is executed cyclically.

After entering the program, the routine proceeds to step S101 wherein the controller 70 of the insulation resistance measuring apparatus 50 resets the absolute value |Z| of the complex impedance calculated in a previous measurement cycle (which will also be referred to below as a previously measured value |Zf|) to zero. The routine proceeds to step S102 wherein the controller 70 selects a maximum value fmax of frequencies in a predetermined measuring range as the measurement frequency f. The measuring range is selected as a frequency band within which a resistance value of the insulation resistor Rg is detectable and determined in experimentation or simulation.

The routine proceeds to step S103 wherein the controller 70 outputs the measurement frequency f to the lock-in amplifier 53 to detect the complex impedance characteristics. Specifically, when the measurement frequency f is specified by the controller 70, the current output request unit 54 of the lock-in amplifier 53 outputs the request signal S1 to the sine wave current applying device 51 to output the ac signal I of the measurement frequency f. Upon reception of the request signal S1, the sine wave current applying device 51 applies the ac signal I to the measuring resistor Rs in the form of a sine wave current. Additionally, the current output request unit 54 outputs the first reference signal Ref1 of the measurement frequency f to the multiplier 55 and also outputs the second reference signal Ref2 of the measurement frequency f to the multiplier 58.

The lock-in amplifier 53 obtains the voltage V, as developed at the junction M2, through the bandpass filter 52 and then outputs a changing component of the voltage V to the multipliers 55 and 58 of the lock-in amplifier 53 in the form of the response signal Va. The multiplier 55 of the lock-in amplifier 53 produces the product X of the response signal Va and the first reference signal Ref1 and then outputs it to the integrator 56 and the filter 57. The integrator 56 and the filter 57 produce a value proportional to the real part Re_Z of the complex impedance and output it to the controller 70.

Similarly, the multiplier 58 of the lock-in amplifier 53 produces the product Y of the response signal Va and the second reference signal Ref2 and then outputs it to the integrator 59 and the filter 60. The integrator 59 and the filter 60 produce a value proportional to the imaginary part Im_Z of the complex impedance and then output it to the controller 70.

Upon reception of the values proportional to the real part Re_Z and the imaginary part Im_Z of the complex impedance, the controller 70 analyzes those values and the ac signal I to calculate the real part Re_Z and the imaginary part Im_Z of the complex impedance. In this way, the real part Re_Z and the imaginary part Im_Z of the complex impedance are determined in step S103.

Subsequently, the routine proceeds to step S104 wherein the controller 70 calculates the absolute value |Z| of the complex impedance using the real part Re_Z and the imaginary part Im_Z of the complex impedance and then also calculates the phase θ.

The routine proceeds to step S105 wherein the controller 70 determines whether a difference between the absolute value |Z| of the complex impedance, as calculated in this measuring cycle, and the previously measured value |Zf|, as calculated one measurement cycle earlier, is smaller than a given threshold value Zth. The threshold value Zth is selected to be a value near zero in light of a measuring tolerance.

If a NO answer is obtained in step S105 meaning that the difference between the absolute value |Z| and the previously measured value |Zf| is larger than the given threshold value Zth, then the routine proceeds to step S106 wherein the controller 70 decrements the measurement frequency f by a given value to provide an updated value of the measurement frequency f. The routine then proceeds to step S107 wherein the controller 70 determines the absolute value |Z|, as derived in step S104, as the previously measured value |Zf|. The routine then returns back to step S103.

As apparent from the above discussion, step S105 determines whether the absolute value |Z| has been changed from the previously measured value |Zf| with a change in measurement frequency f. In other words, step S105 determines whether the second range T2 or the fourth range T4 illustrated in FIG. 5(b) is now reached or not.

Alternatively, if a YES answer is obtained in step S105, then the routine proceeds to step S108 wherein the controller 70 determines whether the absolute value |Z|, as derived in step S104, is identical with a resistance value of the measuring resistor Rs. The resistance value of the measuring resistor Rs may be selected when the insulation resistance measuring apparatus 50 is designed and is thus a known value.

If a NO answer is obtained in step S108, then the routine proceeds to step S109 wherein the controller 70 concludes that the absolute value |Z| is identical with the total Rtotal and then subtracts the measuring resistor Rs from the absolute value |Z| to derive a resistance value of the insulation resistor Rg. The routine then terminates.

Alternatively, if a YES answer is obtained in step S108, then the routine proceeds to step S110 wherein the controller 70 determines whether the frequency f is lower than or equal to the minimum value fmin of frequencies set in the measuring range. This determination determines whether the calculation of the complex impedance has been completed using all frequencies selected from the measuring range.

If a NO answer is obtained in step S110, then the routine proceeds to step S106. Alternatively, if a YES answer is obtained, then the routine proceeds to step S111 wherein the controller 70 determines the resistance value of the insulation resistor Rg to be zero, meaning that a current leakage is occurring. The routine then terminates.

Upon completion of the measuring operation, the controller 70 outputs the result of calculation of the complex impedance and the value of the insulation resistor Rg to the ECU 100. When the value of the insulation resistor Rg is derived in step S109, the controller 70 compares the value of the insulation resistor Rg with the electrical leakage threshold value to determine whether the current leakage is occurring or not. When the value of the insulation resistor Rg is less than the electrical leakage threshold value, the controller 70 determines that the current leakage is now occurring. When it is determined that the current leakage is occurring and that the resistance value of the insulation resistor Rg is determined to be zero in step S111, the controller 70 informs the ECU 100 of the occurrence of current leakage.

The insulation resistance measuring apparatus 50 in the first embodiment offers the following beneficial advantages.

The sine wave current applying device 51 is, as described above, designed to apply the ac signal I to the measuring resistor Rs. The bandpass filter 52 measures the voltage V at the junction M2 of the sine wave current applying device 51 and the measuring resistor Rs. These arrangements enable required voltage resistances of the bandpass filter 52 and the lock-in amplifier 53 to be lowered by the measuring resistor Rs as compared with when voltage between the coupling capacitor Cs and the measuring resistor Rs is measured, thereby enabling the circuit to be reduced in size.

The lock-in amplifier 53 obtains the response signal Va indicating a voltage variation appearing at the junction M2 between the measuring resistor Rs and the sine wave current applying device 51 through the bandpass filter 52. The lock-in amplifier 53 then derives values proportional to the real part and the imaginary part of the complex impedance using a produce of the response signal Va and the first reference signal Ref1 and a product of the response signal Va and the second reference signal Ref2 and outputs them to the controller 70. The controller 70 then calculates the real part and the imaginary part of the complex impedance using the values inputted thereinto from the lock-in amplifier 53 and determines the resistance value of the insulation resistor Rg using the complex impedance.

As apparent from the above discussion, the lock-in amplifier 53 works to multiply the response signal Va by the first and second reference signals Ref1 and Ref2 to extract from the measured voltage V only a varying component arising from application of the ac signal I to the measuring resistor Rs, in other words, to remove noise from the measured voltage V. The lock-in amplifier 53, therefore, has a digital noise reduction function, thereby improving the accuracy in calculating the complex impedance and also enabling an analog filter, such as the bandpass filter 52, to be simplified in structure.

If a noise frequency in the vehicle is changed, noise may be removed properly from the measured voltage V by altering the range of the measurement frequency f or the software design of the filters 57 and 60 (i.e., low-pass filters) installed in the lock-in amplifier 53. Accordingly, the insulation resistance measuring apparatus 50 may be designed commonly for different types of vehicles without altering an analog filter, such as the bandpass filter 52.

The second range T2 to the fourth range T4 demonstrated in FIG. 5(b) are, as described above, changed with a change in ground capacitance Cg. The second range T2 and the fourth range T4 in which the absolute value |Z| is kept constant may, however, be detected by ensuring a required range of measurement of the frequency f even though the second range T2 to the fourth range T4 are changed with a change in ground capacitance Cg. The absolute value |Z| in the second range T2 or the fourth range T4 will not be changed with a change or shift in the second range T2 or the fourth range T4.

The sine wave current applying device 51 is, therefore, designed to cyclically change the measurement frequency f of the ac signal I within the measuring range. The controller 70 is also designed to specify, of the second range T2 and the fourth range T4 in which the absolute value |Z| is kept constant even though the measurement frequency f has been changed, one (i.e., the second range T2) in which the absolute value |Z| is not identical with the resistance value of the measuring resistor Rs. When determining that the measurement frequency f has been changed, but the absolute value |Z| is kept constant and different from the resistance value of the measuring resistor Rs, the controller 70 determines that the absolute value |Z| agrees with the total Rtotal. This ensures the stability in accuracy of calculation of the absolute value |Z|, that is, the resistance value of the insulation resistor Rg regardless of a change in ground capacitance Cg, thereby enabling the current leakage to be detected precisely.

Second Embodiment

The insulation resistance measuring apparatus 50 in the second embodiment will be described below. The similar or same reference numbers as those in the first embodiment will refer to similar or same parts, and explanation thereof in detail will be omitted here.

Figures 8A, 8B:
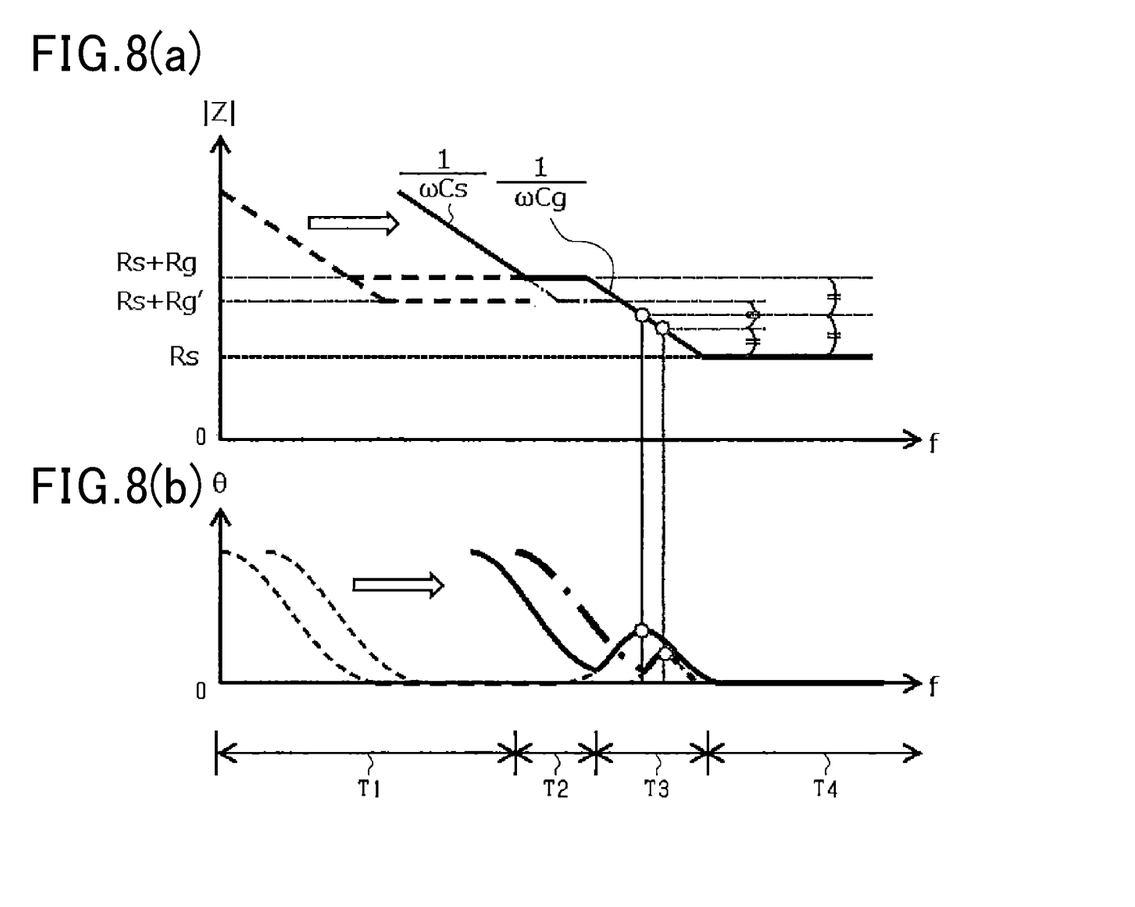
FIG. 8(a) is a view which represents a relation between a measurement frequency and an absolute value of a complex impedance in the second embodiment.
FIG. 8(b) is a view which represents a relation between a measurement frequency and a phase of a complex impedance in the second embodiment.

The absolute value |Z| of the complex impedance, as already discussed in the first embodiment, has the relation to the measurement frequency f in FIGS. 5(*a*) and 5(*b*). The first range T1 in which the absolute value |Z| of the complex impedance changes in reverse proportion to the measurement frequency f depends upon a value (i.e., 1/ωCg) associated with the angular velocity ω and the ground capacitance Cg. For instance, a decrease in coupling capacitor Cs, as illustrated in FIGS. 8(*a*) and 8(*b*), will cause the first range T1 to be shifted to a high frequency side.

Too small a coupling capacitor Cs will result in disappearance of the second range T2 in which the absolute value |Z| of the complex impedance is kept constant regardless of a change in measurement frequency for an insufficient decrease in the second range T2. In other words, too small the coupling capacitor Cs, as can be seen in a complex plane in FIG. 7, will result in difficulty in deriving the total Rtotal of resistance values of the measuring resistor Rs and the insulation resistor Rg. The way to determine the resistance value of the insulation resistor Rg in the first embodiment is, therefore, required to keep the coupling capacitor Cs at a larger value. In order to alleviate such a drawback, the insulation resistance measuring apparatus 50 in the second embodiment is designed to be capable of detecting the resistance value of the insulation resistor Rg even if the coupling capacitor Cs is reduced in size thereof.

The principle that enables the resistance value of the insulation resistor Rg to be determined even if the capacitance of the coupling capacitor Cs is decreased, in other words, the second range T2 in which the total Rtotal disappears will first be described.

Figure 7:
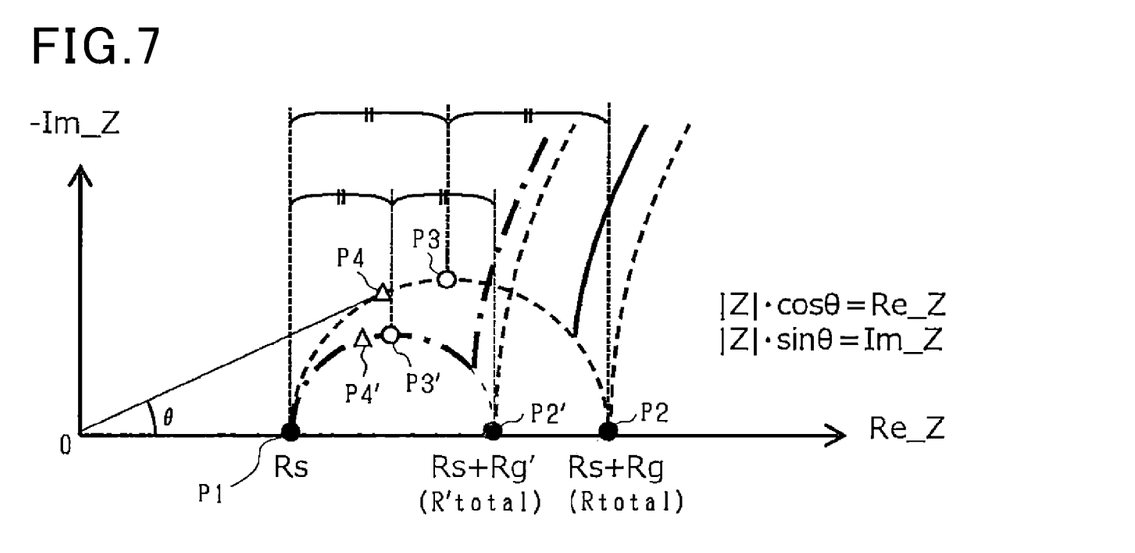
FIG. 7 is a view which represents complex impedance characteristics in the second embodiment.

The complex impedance characteristic is, as demonstrated in FIG. 7, expressed in a semicircular form between the point P1 where the imaginary part Im_Z of the complex impedance is zero, and the real part Re_Z of the complex impedance agrees with the measuring resistor Rs and the point P2 where the imaginary part Im_Z of the complex impedance is zero, and the real part Re_Z of the complex impedance agrees with the total Rtotal. It is, therefore, found that the imaginary part Im_Z of the complex impedance is maximized at the intermediate point P3 between the points P1 and P3. It is also known that the point P4 where the phase θ of the complex impedance is maximized is slightly further from the intermediate point P3.

Figure 9:
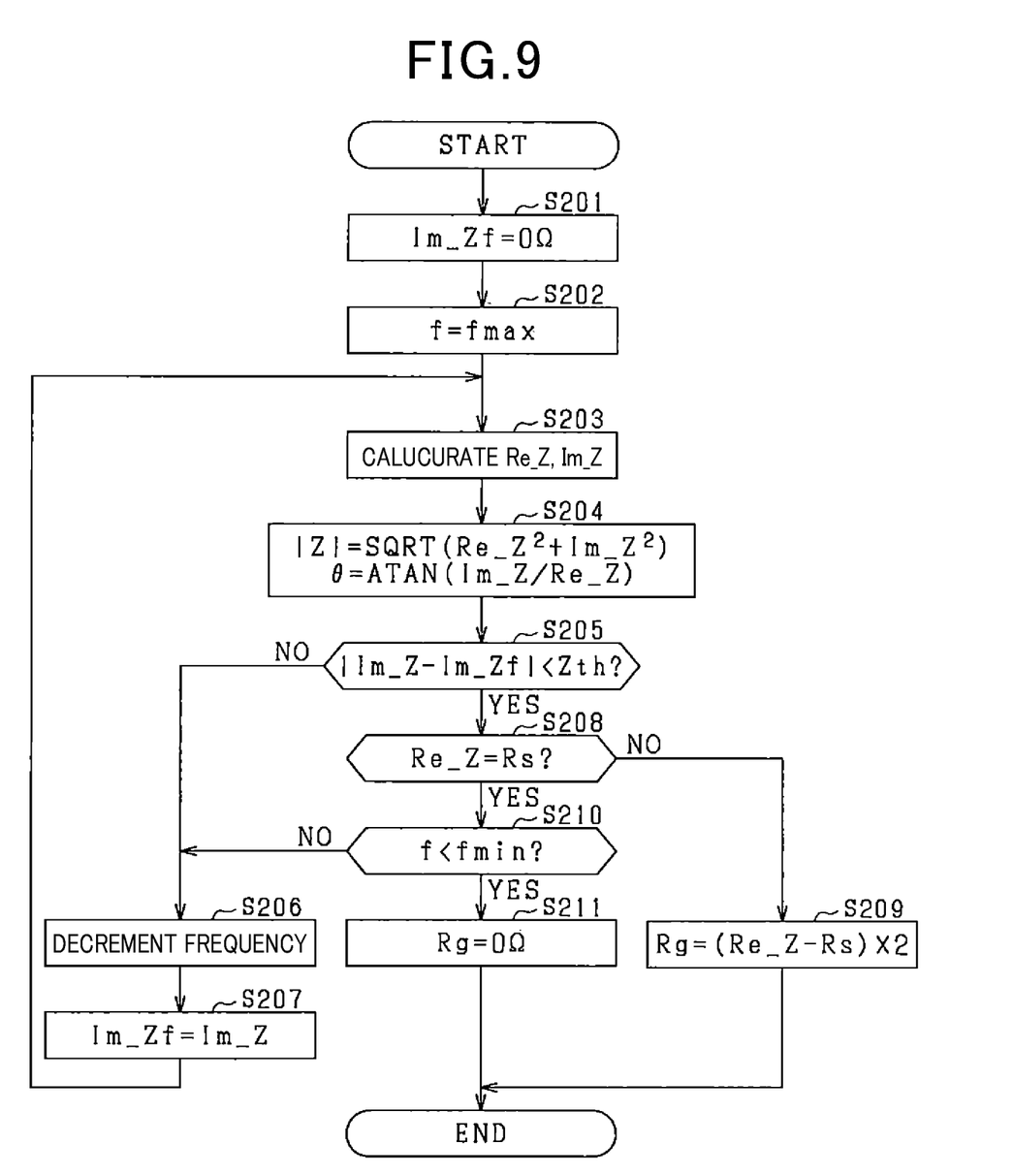
FIG. 9 is a flowchart of an insulation resistance measuring program executed by an insulation resistance measuring apparatus in the second embodiment.

The resistance value of the insulation resistor Rg is, therefore, derived by calculating a value of the real part Re_Z of the complex impedance at the intermediate point P3 where the imaginary part Im_Z of the complex impedance is maximized because the resistance value of the measuring resistor Rs is already known. Specifically, the resistance value of the insulation resistor Rg is obtained by subtracting the resistance value of the measuring resistor Rs from the real part Re_Z of the complex impedance at the intermediate point P3 and doubling it. FIG. 9 is a flowchart of a measuring program executed to calculate the resistance value of the insulation resistor Rg in the second embodiment.

After entering the program, the routine proceeds to step S201 wherein the controller 70 of the insulation resistance measuring apparatus 50 resets the imaginary part Im_Z of the complex impedance calculated in a previous measurement cycle (which will also be referred to below as a previous imaginary part Im_Zf) to zero. Operations in steps S202 to S204 are the same as those in steps S102 to S104, and explanation thereof in detail will be omitted here.

After step S204, the routine proceeds to step S205 wherein the controller 70 determines whether a difference between the imaginary part Im_Z of the complex impedance derived in this measurement cycle and the previous imaginary part Im_Zf is less than a given threshold value Zth. The threshold value Zth is selected to be near zero in view of a measuring tolerance. Step S205, therefore, determines whether the imaginary part Im_Z derived in this measuring cycle has been changed from the previous imaginary part Im_Zf after the measurement frequency f is changed, in other words, whether the imaginary part Im_Z is maximized or not.

If a NO answer is obtained in step S205, then the routine proceeds to step S206 wherein the controller 70 decrements the measurement frequency f by a given value to provide an updated value of the measurement frequency f. The routine then proceeds to step S207 wherein the controller 70 determines the imaginary part Im_Z derived in step S204 as the previous imaginary part Im_Zf. The routine then returns back to step S203.

Alternatively, if a YES answer is obtained in step S205, then the routine proceeds to step S208 wherein the controller 70 determines whether the real part Re_Z of the complex impedance, as derived in step S203, is identical with a resistance value of the measuring resistor Rs.

If a NO answer is obtained in step S208, then the routine proceeds to step S209 wherein the controller 70 subtracts the resistance value of the measuring resistor Rs from the real part Re_Z of the complex impedance and then multiplies it by two. The controller 70 then determines the result of the multiplication as the resistance value of the insulation resistor Rg. The routine then terminates.

Alternatively, if a YES answer is obtained in step S208, then the routine proceeds to step S210. The operations in steps S210 and S211 are the same as those in step S110 and S111, and explanation thereof in detail will be omitted here.

The insulation resistance measuring apparatus 50 in the second embodiment offers the following beneficial advantages.

The measurement frequency f is, as described above, changed cyclically within the measuring range. The controller 70 determines whether the imaginary part Im_Z of the complex impedance calculated has reached the maximum value or not. Subsequently, the controller 70 subtracts the resistance value of the measuring resistor Rs from the real part Re_Z of the complex impedance when the imaginary part Im_Z of the complex impedance reaches the maximum value and then multiplies it by two to derive the resistance value of the insulation resistor Rg. As long as the capacitance of the coupling capacitor Cs is higher than the ground capacitance Cg, it is possible to specify the maximum value of the imaginary part Im_Z.

It is, therefore, possible to specify the time when the imaginary part Im_Z of the complex impedance is maximized and determine the resistance value of the insulation resistor Rg using the real part Re_Z of the complex impedance when the maximum value of the imaginary part Im_Z is reached as long as the capacitance of the coupling capacitor Cs is higher than the ground capacitance Cg even though the capacitance of the coupling capacitor Cs is too small to determine the second range T2. This enables the capacitance of the coupling capacitor Cs to be decreased to reduce the size of the circuit as compared with the first embodiment.

Modifications

The above embodiments may be modified in the following ways.

The insulation resistance measuring apparatus 50 may be designed to inform the ECU 100 about the resistance value of the insulation resistor Rg to enable the ECU 100 to diagnose the current leakage using the resistance value of the insulation resistor Rg.

The insulation resistance measuring apparatus 50 in the first embodiment determines in step S105 whether the absolute value |Z| of the complex impedance has become kept constant, but may alternatively be designed to determine whether the phase θ of the complex impedance has become zero (or a value near zero in view of a measurement tolerance). The insulation resistance measuring apparatus 50 may alternatively be designed to determine whether the measuring frequency f has been changed, but the phase θ of the complex impedance is kept zero for a given period of time.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

The above described controllers or operations thereof may be realized by a computer which is equipped with a processor and a memory and programmed to execute one or a plurality of tasks or alternatively established by a computer equipped with a processor made of one or a plurality of hardware logical circuits. The controllers or operations may alternatively be realized by a combination of an assembly of a processor with a memory which is programmed to perform one or a plurality of tasks and a processor made of one or a plurality of hardware logical circuits. Computer-executed programs may be stored as computer executed instructions in a non-transitory computer readable medium.

What is claimed is:

1. An insulation resistance measuring apparatus comprising:
    a coupling capacitor which is connected at a first end thereof to a power supply path leading to a dc power supply;
    a measuring resistor which is connected to a second end of the coupling capacitor;
    a current applying device which is connected to the measuring resistor and applies an ac current to the measuring resistor;
    a detector which detects a voltage change at a junction of the current applying device and the measuring resistor when the ac current is applied to the measuring resistor; and
    a calculator which calculates a complex impedance in an ac circuit using the ac current and the voltage change derived by the detector, the ac circuit including the measuring resistor, the coupling capacitor, an insulation resistor, and a grounding capacitance, the insulation resistor being disposed between the power supply path and ground, the calculator determining a resistance value of the insulation resistor using the complex impedance.

2. The insulation resistance measuring apparatus as set forth in claim 1, wherein the detector calculates a first product of a first reference signal produced synchronously with the ac current and the voltage change and a second product of a second reference signal and the voltage change, the second reference signal being out of phase with the ac current by a given angle, and wherein the calculator calculates the complex impedance using the first and second products.

3. The insulation resistance measuring apparatus as set forth in claim 2, wherein the first reference signal is 90° out of phase with the second reference signal.

4. The insulation resistance measuring apparatus as set forth in claim 1, wherein the current applying device alters a frequency of the ac current cyclically in a given measuring range, and wherein when the frequency of the ac current is altered, but the complex impedance is kept constant, and when a real part or an absolute value of the complex impedance is not identical with a resistance value of the measuring resistor, the calculator determines the resistance value of the insulation resistor based on the real part or the absolute value of the complex impedance.

5. The insulation resistance measuring apparatus as set forth in claim 1, wherein the current applying device alters a frequency of the ac current cyclically in a given measuring range, and wherein the calculator subtracts a resistance value of the measuring resistor from a real part of the complex impedance derived when an imaginary part of the complex impedance is maximized and multiplies it by two to determine the resistance value of the insulation resistor.

* * * * *